US012787848B2

(12) United States Patent
Hayashi

(10) Patent No.: US 12,787,848 B2
(45) Date of Patent: Nov. 3, 2026

(54) SEMICONDUCTOR MODULE AND SEMICONDUCTOR DEVICE

(71) Applicant: FUJI ELECTRIC CO., LTD., Kawasaki (JP)

(72) Inventor: Naoki Hayashi, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 461 days.

(21) Appl. No.: 18/477,228

(22) Filed: Sep. 28, 2023

(65) Prior Publication Data

US 2024/0030078 A1 Jan. 25, 2024

Related U.S. Application Data

(63) Continuation of application No. PCT/JP2022/033354, filed on Sep. 6, 2022.

(30) Foreign Application Priority Data

Oct. 14, 2021 (JP) ................................ 2021-168928

(51) Int. Cl.
*H10W 74/10* (2026.01)
*H10W 70/65* (2026.01)
(Continued)

(52) U.S. Cl.
CPC ........ *H10W 74/111* (2026.01); *H10W 70/658* (2026.01); *H10W 90/00* (2026.01);
(Continued)

(58) Field of Classification Search
CPC ............. H10W 74/111; H10W 74/114; H10W 76/10–18
See application file for complete search history.

(56) References Cited

U.S. PATENT DOCUMENTS 6,534,711 B1 * 3/2003 Pollack ................. H01L 23/057 174/530
8,148,808 B2 * 4/2012 Braden ................... H01L 23/24 257/773
(Continued)

FOREIGN PATENT DOCUMENTS

JP S62-61349 A 3/1987
JP 2002-246496 A 8/2002
(Continued)

OTHER PUBLICATIONS

Machine translation of JP 2016096188 A (Year: 2016).*
(Continued)

*Primary Examiner* — Bryan R Junge
(74) *Attorney, Agent, or Firm* — Rabin & Berdo, P.C

(57) ABSTRACT

A semiconductor module includes: a laminated substrate configured by laminating an insulating plate, a heat dissipation plate disposed on a lower surface of the insulating plate, and a circuit plate disposed on an upper surface of the insulating plate; a semiconductor element disposed on an upper surface of the circuit plate; a case that surrounds the laminated substrate and a space housing the semiconductor element; a sealing resin filling the space of the case to seal the semiconductor element; and a partition wall that extends in an up-down direction to divide the space filled with the sealing resin into a plurality of subspaces. The partition wall has a lower end and an upper end opposite to each other in the up-down direction. At least a portion of the lower end of the partition wall is connected to the upper surface of the circuit plate.

17 Claims, 13 Drawing Sheets

(51) Int. Cl.
*H10W 90/00* (2026.01)
*H10W 72/00* (2026.01)
*H10W 74/00* (2026.01)

(52) U.S. Cl.
CPC .......... *H10W 72/884* (2026.01); *H10W 74/00* (2026.01); *H10W 90/736* (2026.01); *H10W 90/753* (2026.01); *H10W 90/755* (2026.01)

(56) References Cited

U.S. PATENT DOCUMENTS

| | | | | |
|---|---|---|---|---|
| 11,721,602 | B2 * | 8/2023 | Hung | H01L 23/367<br>257/704 |
| 2017/0127523 | A1 * | 5/2017 | Fritz | H05K 1/0216 |
| 2017/0330812 | A1 * | 11/2017 | Bolognia | H01L 23/552 |
| 2020/0105640 | A1 * | 4/2020 | Chiu | H01L 23/16 |
| 2021/0305227 | A1 * | 9/2021 | Chen | H01L 23/04 |
| 2022/0108959 | A1 * | 4/2022 | Nishimura | H01L 23/562 |

FOREIGN PATENT DOCUMENTS

| | | | |
|---|---|---|---|
| JP | 2002-299521 | A | 10/2002 |
| JP | 5602077 | B2 | 10/2014 |
| JP | 2016-096188 | A | 5/2016 |

OTHER PUBLICATIONS

International Search Report for PCT/JP2022/033354, mailed on Nov. 22, 2022.
Written Opinion for PCT/JP2022/033354, mailed on Nov. 22, 2022.

* cited by examiner

SEMICONDUCTOR MODULE AND SEMICONDUCTOR DEVICE

CROSS REFERENCE TO RELATED APPLICATIONS

This is a continuation application of International Application PCT/JP2022/033354 filed on Sep. 6, 2022 which claims priority from a Japanese Patent Application No. 2021-168928 filed on Oct. 14, 2021, the contents of which are incorporated herein by reference.

BACKGROUND

Technical Field

The present invention relates to a semiconductor module and a semiconductor device.

Related Art

The semiconductor module includes a substrate provided with a semiconductor element such as an insulated gate bipolar transistor (IGBT), a power metal oxide semiconductor field effect transistor (MOSFET), or a free wheeling diode (FWD), and is used for an inverter device or the like.

In this type of semiconductor module, for example, in JP S62-61349 A, JP 5602077 B2, and JP 2002-246496 A, a semiconductor element is disposed on an insulating substrate (which may be referred to as laminated substrate), and a frame-shaped case is disposed so as to surround a periphery of the semiconductor element. A space inside the case is filled with, for example, a gel-like resin. By curing the resin (sealing resin), various configurations in the case are sealed.

SUMMARY

Meanwhile, in the process of manufacturing the semiconductor module as described above, when curing of the resin starts in the process of filling or casting the resin, shrinkage stress is generated inside the resin. As a result, the adjacent insulating substrate may be warped in a predetermined direction. The warpage of the insulating substrate can be a factor that affects adhesion with a peripheral configuration (for example, a resin case or a heat sink).

The present invention has been made in view of such a point, and an object of the present invention is to provide a semiconductor module and a semiconductor device capable of suppressing warpage of a laminated substrate due to shrinkage during curing of a sealing resin.

A semiconductor module according to one aspect of the present invention includes: a laminated substrate configured by laminating an insulating plate including an upper surface and a lower surface, a heat dissipation plate disposed on the lower surface of the insulating plate, and a circuit plate disposed on the upper surface of the insulating plate; a semiconductor element disposed on an upper surface of the circuit plate; a case that surrounds the laminated substrate and houses the semiconductor element; a sealing resin that is filled in the case and seals the semiconductor element; and a partition wall that extends in an up-down direction and divides the sealing resin into a plurality of the sealing resins, in which an end of the partition wall is connected to at least a part of the upper surface of the circuit plate.

According to the present invention, it is possible to suppress warpage of the laminated substrate due to shrinkage during curing of the sealing resin.

DETAILED DESCRIPTION

Figure 1:
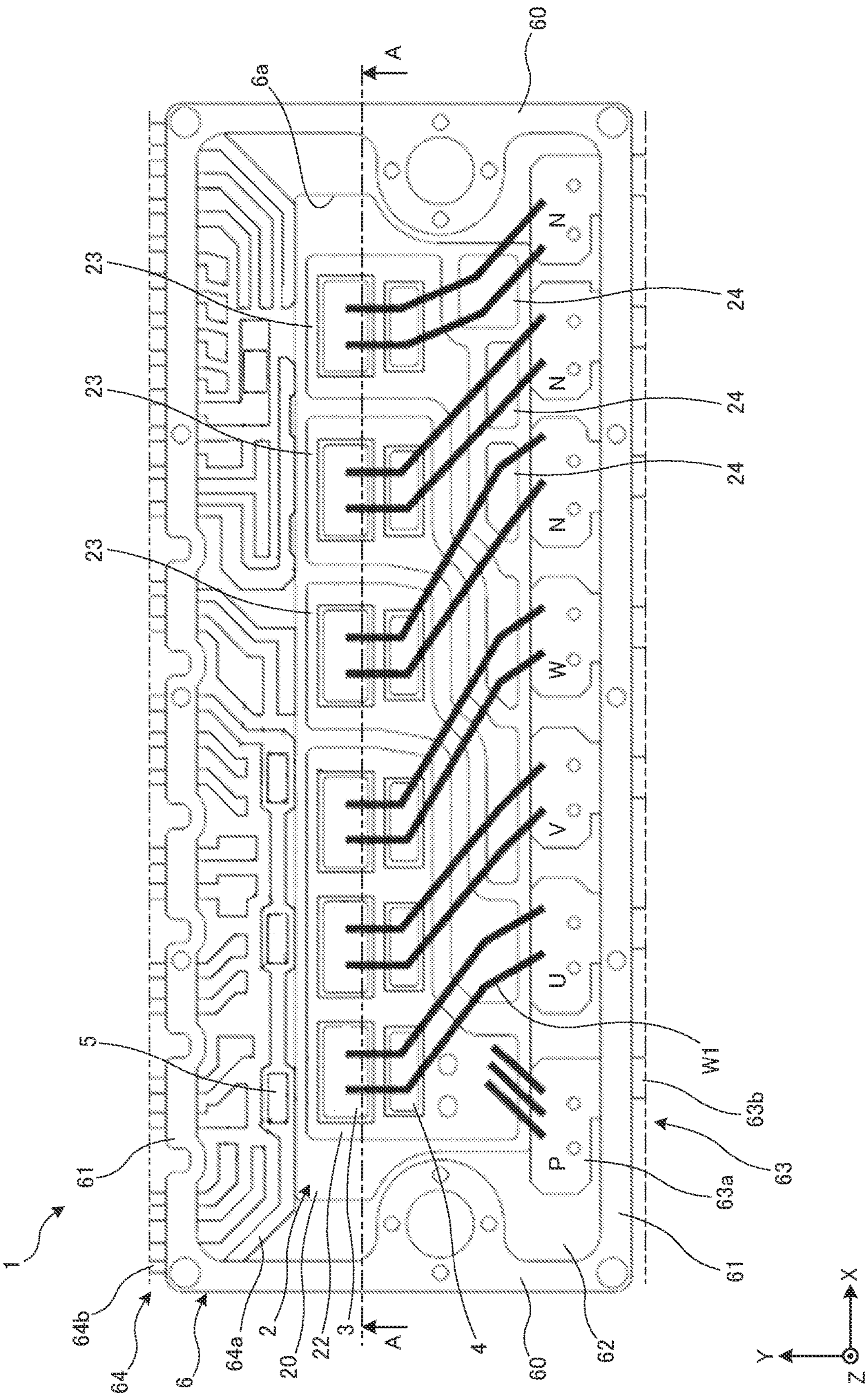
FIG. 1 is a plan view of a semiconductor module according to a comparative example.
Figure 2:
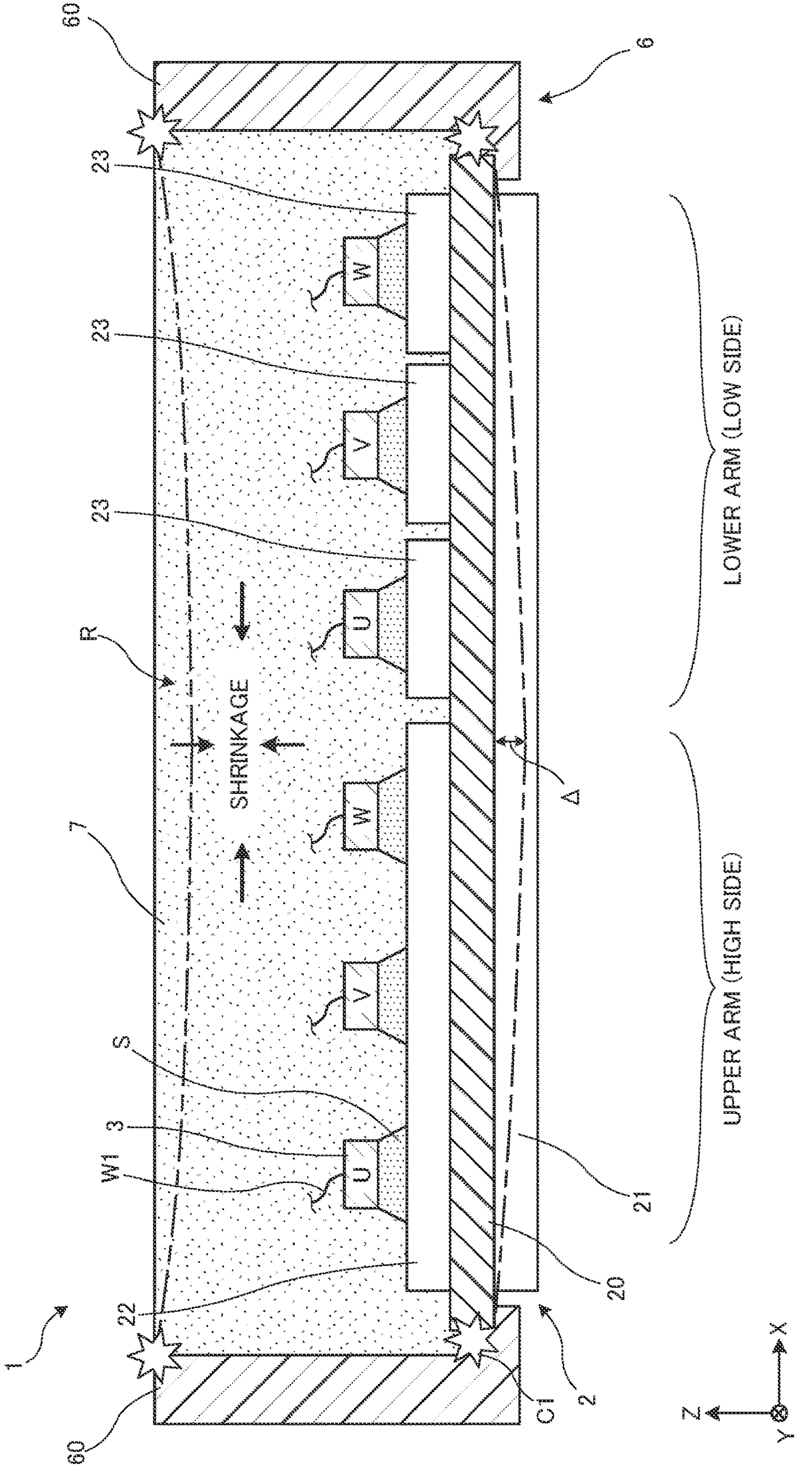
FIG. 2 is a cross-sectional view taken along line A-A of FIG. 1.
Figure 3:
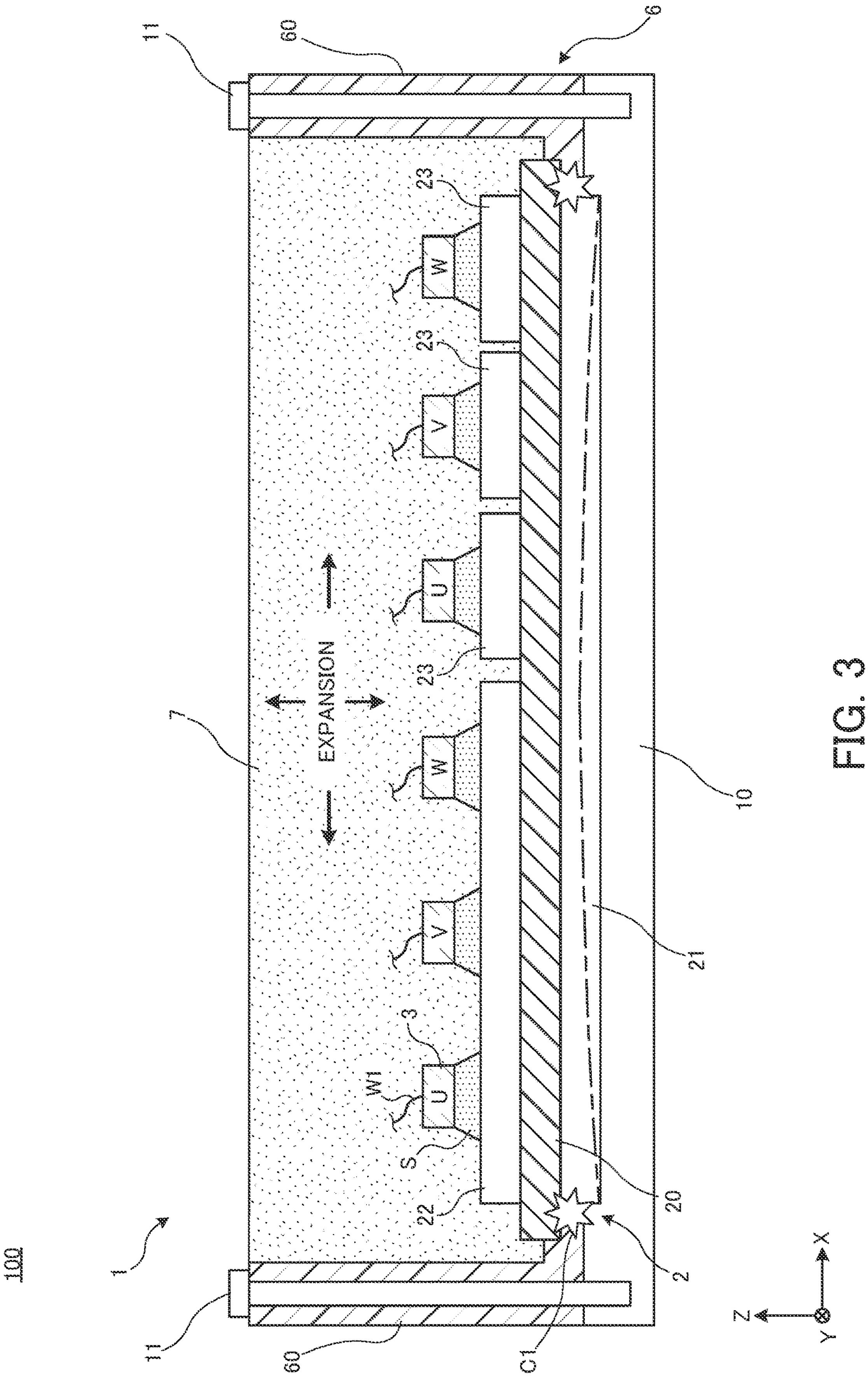
FIG. 3 is a schematic diagram illustrating an example of a semiconductor device according to the comparative example.
Figure 4:
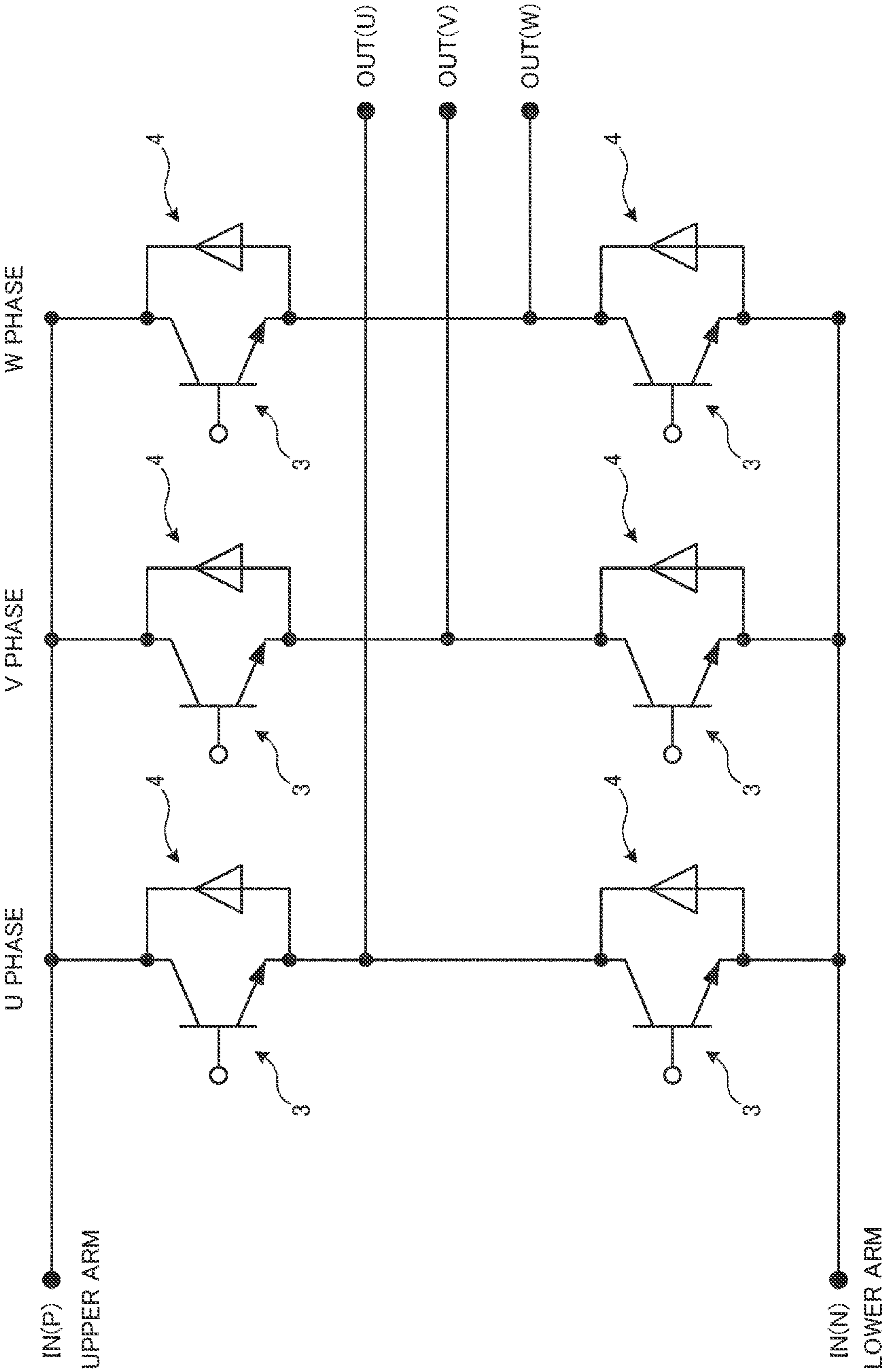
FIG. 4 is a schematic diagram illustrating an example of a circuit configuration of the semiconductor module.
Figure 5:
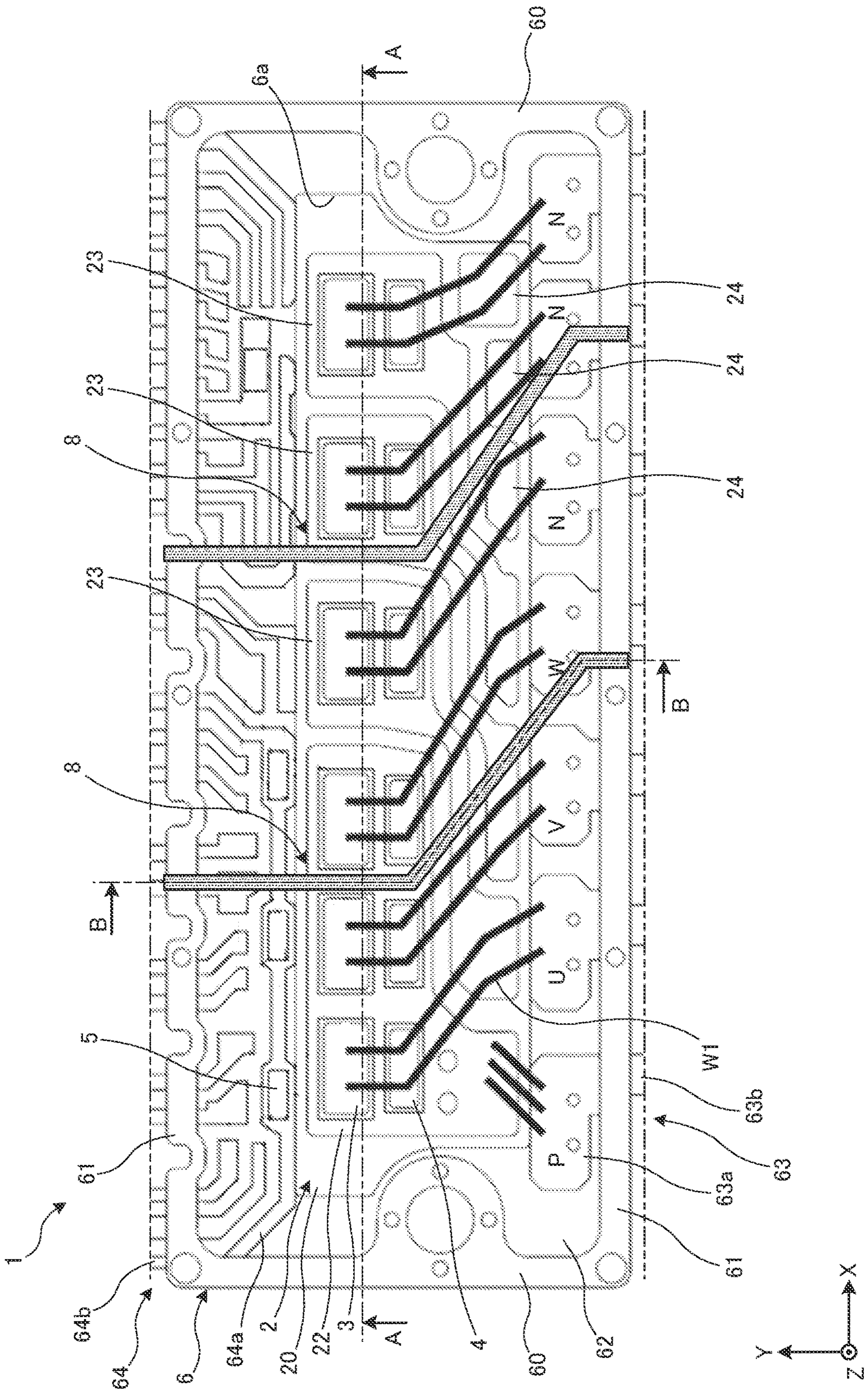
FIG. 5 is a plan view of a semiconductor module according to the present embodiment.
Figure 6:
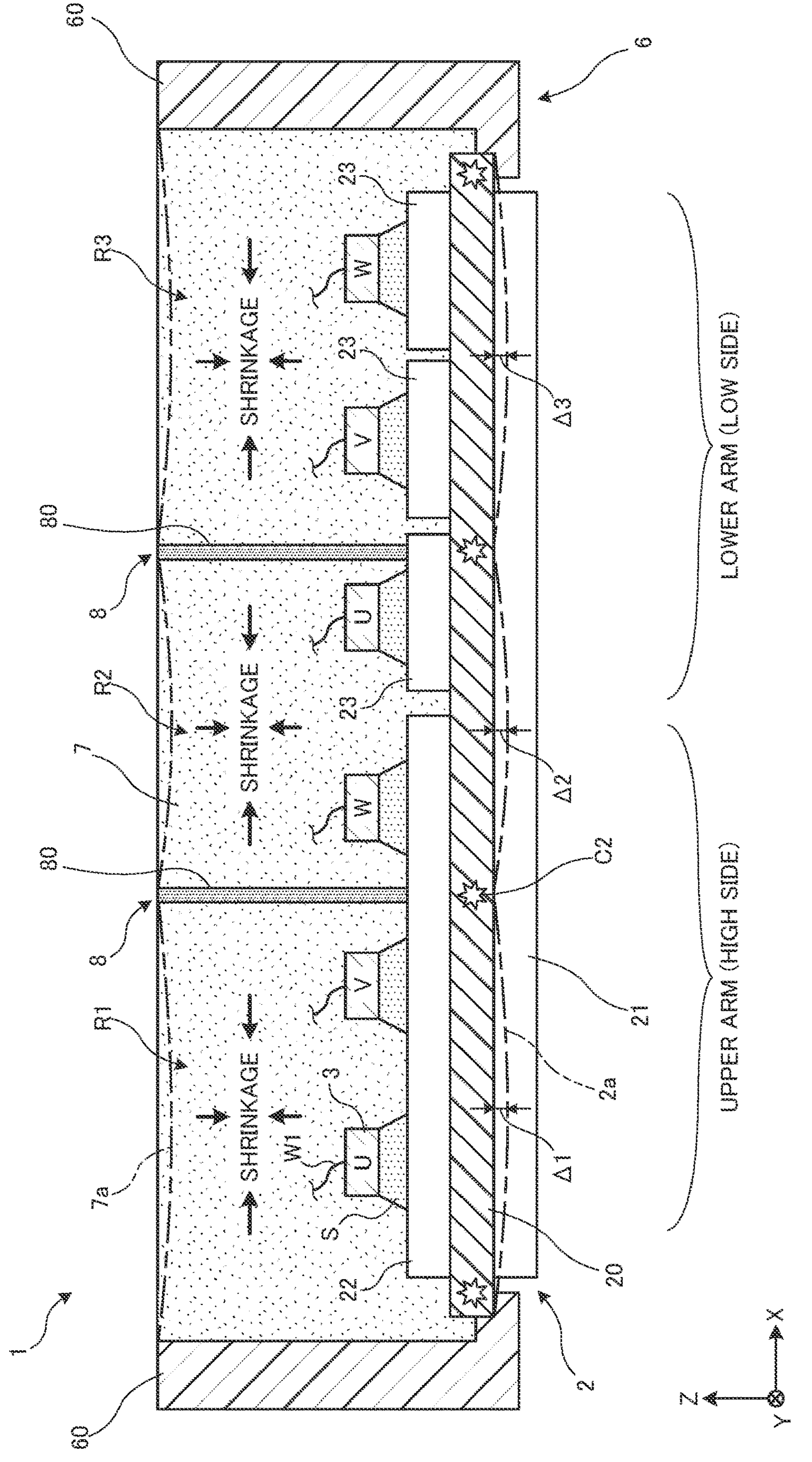
FIG. 6 is a cross-sectional view taken along line A-A of FIG. 5.
Figure 7:
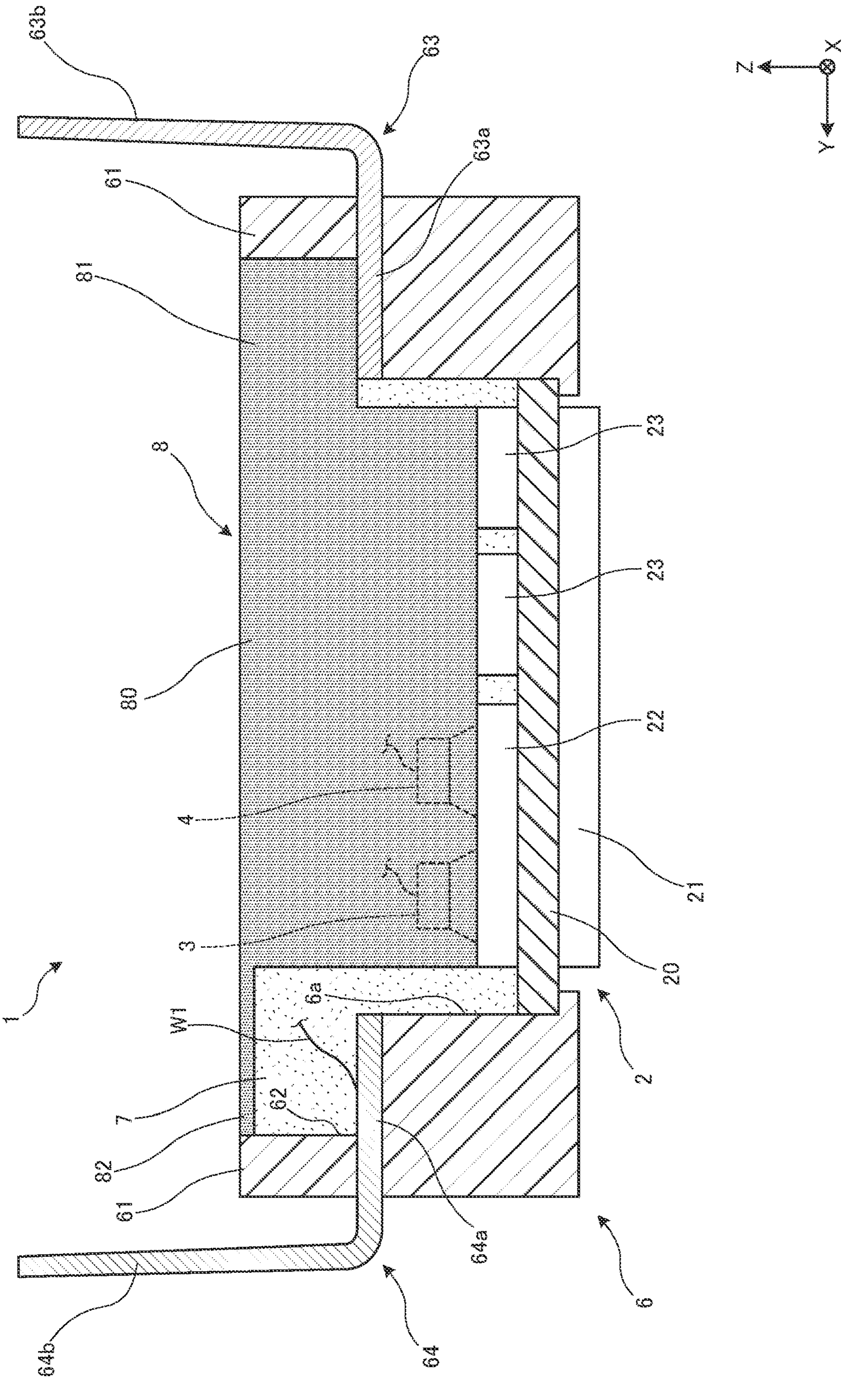
FIG. 7 is a cross-sectional view taken along line B-B in FIG. 5.
Figure 8:
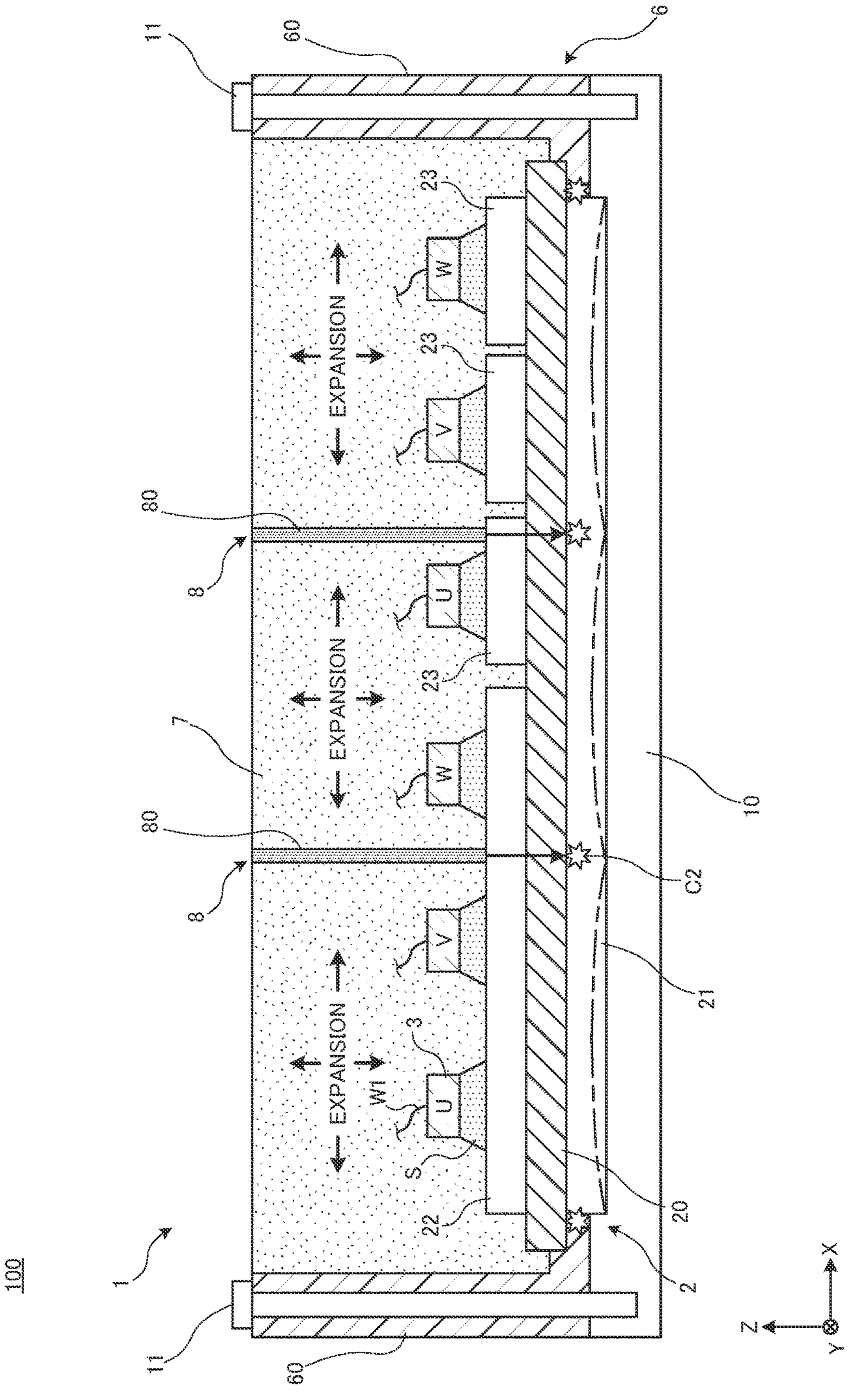
FIG. 8 is a schematic diagram illustrating an example of a semiconductor device according to the present embodiment.

Hereinafter, a semiconductor module and a semiconductor device to which the present invention can be applied will be described. FIG. 1 is a plan view of a semiconductor module according to a comparative example. FIG. 2 is a cross-sectional view taken along line A-A of FIG. 1. FIG. 3 is a schematic diagram illustrating an example of a semiconductor device according to the comparative example. FIG. 4 is a schematic diagram illustrating an example of a circuit configuration of the semiconductor module. FIG. 5 is a plan view of a semiconductor module according to the present embodiment. FIG. 6 is a cross-sectional view taken along line A-A of FIG. 5. FIG. 7 is a cross-sectional view taken along line B-B in FIG. 5. FIG. 8 is a schematic diagram illustrating an example of a semiconductor device according to the present embodiment.

Note that a semiconductor module described below is merely an example, and can be appropriately changed without being limited thereto. Furthermore, the comparative example and the present embodiment described below are different only in the presence or absence of a partition wall to be described later, and the basic configuration is substantially common. Therefore, the same reference signs are given to the configurations having the same names, and the description thereof is appropriately omitted.

Furthermore, in the following drawings, a longitudinal direction of the semiconductor module (cooler) is defined as an X direction, a lateral direction of the semiconductor module (cooler) is defined as a Y direction, and a height direction (thickness direction of a substrate) is defined as a Z direction. Furthermore, the longitudinal direction of the semiconductor module indicates a direction in which a plurality of circuit plates are arranged. The X, Y, and Z axes illustrated are orthogonal to each other and form a righthanded system. Furthermore, in some cases, the X direction may be referred to as a left-right direction, the Y direction may be referred to as a front-rear direction, and the Z direction may be referred to as an up-down direction. These directions (front, back, left, right, and up and down directions) are words used for convenience of description, and a correspondence relationship with each of the XYZ directions may change depending on an attachment posture of the semiconductor module. For example, a heat dissipation surface side (cooler side) of the semiconductor module is referred to as a lower surface side, and an opposite side is referred to as an upper surface side. Furthermore, in the present specification, the plan view means a case where an upper surface or a lower surface of the semiconductor module is viewed from the Z direction.

A semiconductor module 1 according to the present embodiment is applied to, for example, a power conversion device such as a power control unit of an industrial or in-vehicle motor, and is a power semiconductor module constituting a three-phase inverter circuit (See FIG. 4.). In the present embodiment, an intelligent power module (IPM) in which a switching element and an IC chip are packaged will be described as an example.

As illustrated in FIGS. 1 to 8, the semiconductor module 1 includes a laminated substrate 2, a plurality of semiconductor elements 3 and 4, a plurality of integrated circuit elements 5, a case 6, and a sealing resin 7 that seals these elements.

In the present embodiment, the semiconductor module 1 forms a three-phase inverter circuit illustrated in FIG. 4 as a whole. As illustrated in FIGS. 1 to 5, in the semiconductor module 1, an upper arm (which may be referred to as a high side) and a lower arm (which may be referred to as a low side) are arranged side by side in the X direction. Furthermore, in each arm, a U phase, a V phase, and a W phase are arranged side by side.

The laminated substrate 2 is constituted by, for example, a ceramic laminated substrate such as a direct copper bonding (DCB) substrate or an active metal brazing (AMB) substrate, or a metal base substrate. The laminated substrate 2 is formed by laminating an insulating plate 20, a heat dissipation plate 21, and a plurality of circuit plates 22 to 24, and is formed in a rectangular shape as a whole in plan view.

Specifically, the insulating plate 20 is formed of a plate-like body including an upper surface and a lower surface, and has a rectangular shape in plan view elongated in the X direction. In the case of the ceramic laminated substrate, the insulating plate 20 may be formed of, for example, a ceramic material such as aluminum oxide ($Al_2O_3$), aluminum nitride (AlN), silicon nitride ($Si_3N_4$), or aluminum oxide ($Al_2O_3$) and zirconium oxide ($ZrO_2$). Furthermore, in the case of the metal base substrate, the insulating plate 20 may be formed of, for example, a thermosetting resin such as an epoxy resin or a polyimide resin, or a composite material using glass or a ceramic material as a filler for the thermosetting resin. The insulating plate 20 preferably has flexibility and may be formed of, for example, a material containing a thermosetting resin. Note that the insulating plate 20 may be referred to as an insulating layer or an insulating film.

The heat dissipation plate 21 has a predetermined thickness and has a rectangular shape in plan view elongated in the Y direction. The heat dissipation plate 21 is formed of, for example, a metal plate having good thermal conductivity such as copper or aluminum. The heat dissipation plate 21 is disposed on the lower surface of the insulating plate 20. A lower surface of the heat dissipation plate 21 is a surface to be attached to a heat sink 10 (See FIG. 8.) to which the semiconductor module 1 is attached, and also functions as a heat dissipation surface (heat dissipation region) for releasing heat of the semiconductor module 1.

Each of the plurality of circuit plates 22 to 24 has a predetermined thickness and is disposed on the upper surface of the insulating plate 20. Each of the circuit plates 22 to 24 is formed in an electrically independent island shape. For example, as illustrated in FIGS. 1 and 5, the circuit plate 22 is formed in an L shape in plan view, and is disposed closer to a negative side in the X direction than a center of the insulating plate 20. Although details will be described later, the circuit plate 22 constitutes a part of a circuit on an upper arm side.

Furthermore, three circuit plates 23 are arranged side by side in the X direction on a positive side in the X direction (right side in the drawing) of the circuit plate 22. As illustrated in FIGS. 1 and 5, each of the circuit plates 23 has a shape bent in a crank shape in plan view. The three circuit plates 23 constitute a part of a circuit on a lower arm side.

Furthermore, on the lower right side of the circuit plates 23 in the drawing, three circuit plates 24 are arranged side by side in the X direction. The three circuit plates 24 constitute a circuit pattern for wire (wiring member W1) relay described later.

The circuit plates 22 to 24 are formed of a metal plate having good thermal conductivity, such as copper or aluminum. The circuit plates 22 to 24 may be referred to as a circuit layer or a circuit pattern. Note that the shapes, numbers, arrangements locations, and the like of the circuit plates can be appropriately changed without being limited thereto.

The semiconductor elements 3 and 4 are disposed on an upper surface of a predetermined circuit plate via a bonding material S such as solder. The semiconductor elements 3 and 4 are formed in a rectangular shape in plan view by a semiconductor substrate such as silicon (Si) or silicon carbide (SiC), for example. As the semiconductor element, a switching element such as an insulated gate bipolar transistor (IGBT) or a power metal oxide semiconductor field effect transistor (MOSFET), or a diode such as a free wheeling diode (FWD) is used.

In the present embodiment, the semiconductor elements 3 and 4 are arranged in pairs for each arm and each phase. As illustrated in FIG. 4, the semiconductor element 3 includes an IGBT element, the semiconductor element 4 includes an FWD element, and the semiconductor elements 3 and 4 are connected in anti-parallel to each other by a wiring member W1 to be described later.

More specifically, as illustrated in FIGS. 1 and 5, three semiconductor elements 3 are arranged on the upper surface of the circuit plate 22. The three semiconductor elements 3 are arranged on the upper surface of the circuit plate 22 so as to be biased toward the positive side in the Y direction and arranged side by side in the X direction. Furthermore, the semiconductor elements 4 are arranged adjacent to each other on the negative side in the Y direction of each semiconductor element 3 on the circuit plate 22. The semiconductor elements 3 and 4 on the circuit plate 22 constitute an upper arm, and three sets of the paired semiconductor elements 3 and 4 constitute the U phase, the V phase, and the W phase from the positive side in the X direction.

Furthermore, on the upper surface of each of the three circuit plates 23, the semiconductor elements 3 and 4 are arranged side by side in the Y direction in pairs. That is, on the upper surface of each of the circuit plates 23, the semiconductor element 3 is disposed on the positive side in the Y direction, and the semiconductor element 4 is disposed on the negative side in the Y direction. A set of semiconductor elements 3 and 4 arranged as a pair on the upper surface of each of the circuit plates 23 constitutes the U phase, the V phase, and the W phase from the positive side in the X direction. Furthermore, these three sets are combined to constitute the lower arm.

Note that, in the present embodiment, the case where the IGBT element and the FWD element are configured separately has been described, but the present invention is not limited thereto, and a reverse conducting (RC)-IGBT in which the IGBT element and the FWD element are integrated, a reverse blocking (RB)-IGBT having a sufficient withstand voltage for reverse bias, or the like may be used as the semiconductor element.

Furthermore, the shapes, the arrangement numbers, the arrangements locations, and the like of the semiconductor elements 3 and 4 can be appropriately changed. Note that the semiconductor elements 3 and 4 in the present embodiment are so-called vertical switching elements in which functional elements such as transistors are formed on the semiconductor substrate, but are not limited thereto, and may be horizontal switching elements.

Furthermore, the case 6 formed so as to surround an outer periphery of the laminated substrate 2 is disposed. The case 6 is formed in a rectangular frame shape in plan view elongated in the X direction, and has a rectangular opening 6*a* at the center. Specifically, the case 6 includes a pair of side walls 60 facing each other in the X direction and a pair of side walls 61 facing each other in the Y direction, and is formed in a rectangular frame shape by connecting respective ends. In this manner, the case 6 surrounds the laminated substrate 2 and houses the semiconductor elements 3 and 4.

The pair of side walls 60 rises in the Z direction and extends in the Y direction. Furthermore, the pair of side walls 61 rises in the Z direction and extends in the X direction. In a plan view, each of the side walls 61 is sufficiently longer than each of the side walls 60. Furthermore, a stepped portion 62 one step lower is formed inside the side walls 60 and 61.

Furthermore, the case 6 is provided with a plurality of main terminals 63 for a main current and a plurality of control terminals 64 for control. Each of the main terminals 63 is formed of a plate-shaped long body and is embedded in the side wall 61 on the negative side in the Y direction. The main terminal 63 includes an inner terminal portion 63*a* whose upper surface is exposed to an upper surface of the stepped portion 62 inside the case 6, and an outer terminal portion 63*b* which penetrates the side wall 61 and is bent in the Z direction.

The main terminal 63 is formed in an L shape in a cross-sectional view by connecting the inner terminal portion 63*a* and the outer terminal portion 63*b* (See FIG. 7.). As illustrated in FIGS. 1 and 5, for example, seven main terminals 63 are arranged side by side in the X direction. In the present embodiment, the seven main terminals 63 form a P terminal, a U terminal, a V terminal, a W terminal, an N terminal, an N terminal, and an N terminal from the negative side in the X direction.

Each of the control terminals 64 is formed of a plate-shaped long body and is embedded in the side wall 61 on the positive side in the Y direction. The control terminal 64 includes an inner terminal portion 64*a* whose upper surface is exposed to the upper surface of the stepped portion 62 inside the case 6, and an outer terminal portion 64*b* which penetrates the side wall 61 and is bent in the Z direction.

The control terminal 64 is formed in an L shape in a cross-sectional view by connecting the inner terminal portion 64*a* and the outer terminal portion 64*b* (See FIG. 7.). As illustrated in FIGS. 1 and 5, for example, seven control terminals 64 are arranged side by side in the X direction.

Each of the main terminals 63 and each of the control terminals 64 are formed of a metal material such as a copper material, a copper alloy-based material, an aluminum alloy-based material, or an iron alloy-based material, and have predetermined electrical conductivity and predetermined mechanical strength. The main terminal 63 may be referred to as a main current lead frame, and the control terminal 64 may be referred to as a control lead frame. Furthermore, shapes, numbers, arrangements locations, and the like of the main terminal 63 and the control terminal 64 are not limited thereto, and can be appropriately changed.

Furthermore, among the plurality of control terminals 64, each of the integrated circuit elements 5 is disposed on an upper surface of the inner terminal portion 64*a* of the predetermined control terminal 64. The integrated circuit element 5 controls driving of the semiconductor element. As illustrated in FIGS. 1 and 5, three integrated circuit elements 5 are disposed on the upper arm side (negative side in the X direction), and one integrated circuit element 5 is disposed on the lower arm side (positive side in the X direction).

The electrical connection between the components disposed in the case 6 is realized by, for example, the wiring member W1. As the wiring member W1, a conductive wire (bonding wire) is used. As the material of the wire, any one of gold, copper, aluminum, a gold alloy, a copper alloy, and an aluminum alloy, or a combination thereof can be used. Furthermore, a member other than the wire can be used as the wiring member. For example, a ribbon can be used as the wiring member.

For example, upper electrodes of the paired semiconductor elements 3 and 4 are electrically connected by the wiring member W1. Furthermore, the predetermined circuit plate and the inner terminal portion 63*a* of the main terminal 63 are also electrically connected by the wiring member W1. Moreover, a gate electrode (not illustrated) of the semiconductor element 3 and the inner terminal portion 64*a* of the control terminal 64 are also electrically connected by the wiring member W1. Note that, in FIGS. 1 and 5, the wiring member W1 connected to the control terminal 64 is omitted for convenience of description.

The semiconductor elements 3 and 4, the plurality of circuit plates 22 and 24, the main terminal 63, the wiring member W1, and the like constitute a three-phase inverter circuit as illustrated in FIG. 4. In FIG. 4, IN(P) represents a positive electrode terminal (high-potential-side input terminal: P terminal), IN(N) represents a negative electrode terminal (low-potential-side input terminal: N terminal), and OUT(U), OUT(V), and OUT(W) represent output terminals of the respective phases. Furthermore, FIG. 4 illustrates an example in which the semiconductor elements 3 and 4 are connected in anti-parallel.

Furthermore, an internal space defined by the frame-shaped case 6 is filled with the sealing resin 7. That is, the laminated substrate 2, the plurality of semiconductor elements 3 and 4 mounted on the laminated substrate 2, the integrated circuit element 5, the wiring member W1, and the like are thereby sealed in the above-described space. Therefore, the case 6 defines (forms) an internal space R that accommodates these configurations (the laminated substrate 2, the plurality of semiconductor elements 3 and 4 mounted on the laminated substrate 2, the integrated circuit element 5, the wiring member W1, and the like). Note that the internal space R may be referred to as an internal region R.

The sealing resin 7 is made of a thermosetting resin. The sealing resin 7 preferably contains at least one of epoxy, silicone, urethane, polyimide, polyamide, and polyamide-imide. For example, an epoxy resin mixed with a filler is suitable for the sealing resin 7 from the viewpoint of insulating properties, heat resistance, and heat dissipation.

Furthermore, as illustrated in FIGS. 3 and 8, a semiconductor device 100 may be configured by disposing the heat sink 10 on the lower surface of the heat dissipation plate 21 of the semiconductor module 1. That is, the semiconductor device 100 includes the semiconductor module 1 and the heat sink 10. The heat sink 10 is formed of a metal such as copper or aluminum, or an alloy containing one or more kinds thereof, and a surface thereof may be subjected to, for example, plating treatment. The heat sink 10 has a joint surface facing a heat dissipation surface (lower surface of the heat dissipation plate 21) of the semiconductor module 1, and is attached with a compound or the like having good thermal conductivity therebetween. For example, the heat sink 10 may be fixed by inserting a bolt 11 into the case 6 and screwing a tip of the bolt 11 into the heat sink 10.

In the manufacturing process of the semiconductor module 1 as described above, the case 6 is attached around the laminated substrate 2, various components are mounted in an inner space (which may be referred to as a cavity) of the case 6, and then a liquid resin (sealing resin) is injected into the cavity. This type of resin is made of, for example, a thermosetting resin, and is cured in a relatively high temperature environment.

The injected resin gradually shrinks when cured by high temperature. For example, as illustrated in the comparative example of FIG. 2, the sealing resin 7 is filled in the internal space R formed inside the case 6. When the sealing resin 7 is cured, the entire sealing resin 7 tends to shrink toward a center of the internal space R. At this time, stress concentration may occur at an interface of the sealing resin 7 as the sealing resin 7 shrinks. For example, the vicinity of an upper end of the case 6 (sidewalls 60 and 61) or the vicinity of an outer peripheral edge of the laminated substrate 2 (insulating plate 20) can be a stress concentration portion C1.

As a result, the upper surface of the sealing resin 7 forms a curved surface recessed downward, and residual stress is generated at the stress concentration portion C1 at the end of the case 6. Furthermore, since the case 6 and the laminated substrate 2 are joined by an adhesive or the like, residual stress is also generated at a boundary portion (the stress concentration portion C1 described above). Furthermore, the laminated substrate 2 (insulating plate 20) is curved so as to protrude downward, and warpage is formed. An amount of warpage at this time is represented by, for example, Δ.

As described above, residual stress is generated at the interface of the sealing resin 7 due to shrinkage when the sealing resin 7 is cured, so that there is a possibility that cracks and peeling occur at the interface. More specifically, the vicinity of the outer peripheral end of the laminated substrate 2 may rise from the end of the case 6. As a result, the heat dissipation of the outer peripheral portion of the semiconductor module 1 (in the vicinity of the outer peripheral end of the laminated substrate 2 described above) is reduced, and thermal destruction of the semiconductor element 3 is likely to occur at the outer peripheral portion.

Furthermore, in the semiconductor device 100 in which the semiconductor module 1 and the heat sink 10 are integrated, the semiconductor module 1 generates heat with the operation of the device. At this time, for example, as illustrated in FIG. 3, the sealing resin 7 tends to expand outward from the center. Accordingly, the laminated substrate 2 (the insulating plate 20 or the heat dissipation plate 21) tends to be deformed so as to protrude upward as the stress concentration portion C1 near the outer peripheral end. That is, during the operation of the device, stress in a direction opposite to the case where the sealing resin 7 shrinks is generated in the laminated substrate 2.

As illustrated in FIG. 3, when the laminated substrate 2 is along so as to protrude upward (be recessed downward), a gap may be generated between the lower surface of the heat dissipation plate 21 and the upper surface of the heat sink 10. That is, adhesion between the heat dissipation plate 21 and the heat sink 10 is reduced, and heat dissipation from the semiconductor element 3 to the heat sink 10 is reduced. As a result, the semiconductor element 3 may be overheated and destroyed. More specifically, in a central portion of the semiconductor device 100 (the portion where the warpage in FIG. 3 is the largest), the heat dissipation is reduced, and the thermal destruction of the semiconductor element 3 is likely to occur.

The thermal deformation as described above is caused by (1) a temperature difference between the sealing resin 7 and the laminated substrate 2 and (2) a difference in thermal expansion coefficient between the sealing resin 7 and the laminated substrate 2 during module operation. Regarding (1), specifically, a temperature of the sealing resin 7 at a position away from the heat sink 10 tends to be higher than that of the laminated substrate 2 close to the heat sink 10.

Furthermore, regarding (2), the thermal expansion coefficient of the sealing resin 7 is larger than that of the laminated substrate 2. More specifically, the thermal expansion coefficient may be the following value.

In a case where the laminated substrate 2 is a ceramic laminated substrate: 3 to $8\times10^{-6}$/K In a case where the laminated substrate 2 is a metal base substrate: 7 to $25\times10^{-6}$/K Sealing resin 7 (in a case where the epoxy resin contains a filler): 14 to $30\times10^{-6}$/K Therefore, the present inventor has focused on the fact that an amount of shrinkage or an amount of expansion of the sealing resin 7 changes according to a size of the internal space R of the case 6 filled with the sealing resin 7, and has arrived at the present invention. That is, the gist of the present invention is to divide the internal space R of the case 6 into a plurality of spaces (subspaces) R1 to R3 by a partition wall 8. Note that the spaces R1 to R3 may be referred to as regions (or three-dimensional regions) R1 to R3. Furthermore, in the present specification, "dividing the internal space R into the plurality of spaces R1 to R3" is not limited to a case where the completely independent spaces R1 to R3 are formed, and is a concept including a case where the respective spaces partially communicate with each other.

Specifically, in the present embodiment, as illustrated in FIGS. 5 to 8, a rectangular internal space R long in the X direction in plan view formed by the case 6 is partitioned by two partition walls 8 extending in the Y direction to form three spaces R1 to R3. Each of these spaces R1 to R3 is filled with a sealing resin 7. Although not particularly illustrated, a coating film may be formed on a surface of a wall portion 80. For example, by forming the coating film of a polyamide resin, a polyamideimide resin or the like, adhesion (chemical bonding force) with the sealing resin 7 can be improved. As a result, stress concentration can be dispersed, and an amount of warpage of the entire module can be alleviated.

As described above, by dividing the internal space R of the case 6 into the plurality of spaces in the longitudinal direction, the sealing resin 7 filled in each of the spaces R1 to R3 shrinks toward a center of each of the spaces R1 to R3 when being cured (See FIG. 6.). This makes it possible to reduce the amount of shrinkage of the sealing resin 7 in each of the spaces R1 to R3 as compared with the case where the sealing resin 7 is accommodated in one relatively large internal space R as in the comparative example.

With the shrinkage of the sealing resin 7, the upper surface of the sealing resin 7 has a shape recessed downward and curved for each of the spaces R1 to R3. More specifically, a curved surface 7*a* recessed downward is formed on the upper surface of the sealing resin 7 in each of the spaces R1 to R3. That is, a plurality of the curved surfaces 7*a* are formed on the upper surface of the semiconductor module 1. A boundary between the adjacent curved surfaces 7*a* is located directly above the partition wall 8 (wall portion Furthermore, the laminated substrate 2 (insulating plate 20 and heat dissipation plate 21) has a curved shape protruding downward at a position corresponding to immediately below each of the spaces R1 to R3. More specifically, in the laminated substrate 2, a curved portion 2*a* protruding downward is formed for each of the spaces R1 to R3. That is, a plurality of the curved portions 2*a* are formed in the laminated substrate 2. A boundary between the adjacent curved portions 2*a* is located immediately below the partition wall 8 (wall portion 80). The curved portion 2*a* may be referred to as a warped portion. Note that FIG. 6 illustrates a case where the warped portions 2*a* are formed in the insulating plate 20, but the present invention is not limited thereto. The warped portions 2*a* may be formed on the heat dissipation plate 21, or may be formed on both the insulating plate 20 and the heat dissipation plate 21.

Amounts of warpage of the warped portions 2*a* in the spaces R1 to R3 can be represented by, for example, Δ1, Δ2, and Δ3, respectively. Since each of the amounts Δ1, Δ2, and Δ3 of warpage in the warped portions 2*a* is smaller than an amount Δ of warpage in the comparative example, the amount of warpage of the entire module in FIG. 6 can also be reduced.

In this case, as illustrated in FIG. 6, stress concentration portions C2 in the present embodiment are generated at a portion corresponding to a portion immediately below the partition wall 8 in the laminated substrate 2 (insulating plate 20) in addition to the boundary portion between the case 6 and the laminated substrate 2. As described above, the sealing resin 7 (space R that is filled with the sealing resin 7) is divided by the partition wall 8 into at least two subspaces R1-R3, so that the stress concentration portions C2 are dispersed in a plurality of places.

As a result, a magnitude of stress concentration at each of the stress concentration portions C2 is smaller than that in the comparative example. As described above, according to the present embodiment, since the sealing resin 7 is divided into the plurality of parts by the partition wall 8, the amount of shrinkage of the sealing resin 7 per one part can be reduced. As a result, it is possible to suppress warpage of the laminated substrate 2 due to shrinkage of the sealing resin 7 and to suppress cracks and peeling at the boundary surface between the case 6 and the sealing resin 7.

As illustrated in FIG. 8, during the module operation, the semiconductor module 1 generates heat in accordance with the operation of the device. At this time, the sealing resin 7 expands, and the laminated substrate 2 (insulating plate 20) tends to deform so as to protrude upward. That is, during the operation of the device, stress in a direction opposite to the case where the sealing resin 7 shrinks is generated in the laminated substrate 2.

In the present embodiment, the sealing resin 7 is divided (partitioned) into three parts corresponding to the spaces (subspaces) R1 to R3. Therefore, even if each of the sealing resins 7 is expanded, an amount of expansion is smaller than that of the single sealing resin 7 as illustrated in FIG. 3. At this time, the laminated substrate 2 tends to deform so as to protrude upward for each divided sealing resin 7 (See a portion indicated by a two-dot chain line in FIG. 8.).

That is, in FIG. 8, the stress concentration portions C2 are generated at a portion corresponding to the portion immediately below the partition wall 8 in the laminated substrate 2 (insulating plate 20) in addition to the boundary portion between the case 6 and the laminated substrate 2. As described above, the sealing resin 7 is divided by the partition wall 8, so that the stress concentration portions C2 are dispersed in a plurality of places.

Furthermore, ends (lower ends) of the partition walls 8 (wall portions 80 described later) which partitions the sealing resin 7 are joined to the upper surfaces of the circuit plates 22 and 23. As described above, since the lower ends of the partition walls 8 are fixed to the upper surfaces of the circuit plates 22 and 23, even if the laminated substrate 2 tends to warp upward due to thermal expansion during operation, a force that pushes back downward from the partition walls 8 acts. Therefore, deformation of the laminated substrate 2 is suppressed. More specifically, a deformation amount of the laminated substrate 2 is suppressed at a portion corresponding to immediately below each of the sealing resins 7 divided into the plurality of regions as compared with the comparative example of FIG. 3. That is, the partition walls 8 can suppress deformation of the semiconductor module 1 even during operation of the device. Accordingly, a gap is not formed between the semiconductor module 1 (heat dissipation plate 21) and the heat sink 10 during the operation of the device, and the adhesion between the heat dissipation plate 21 and the heat sink 10 is not affected. Therefore, it is possible to secure long-term reliability and good heat dissipation performance.

Furthermore, as illustrated in FIG. 7, the partition wall 8 according to the present embodiment is configured by connecting the wall portion 80 and two beams (a first beam 81 and a second beam 82), and has a T-shape in a cross-sectional view (viewed from the X direction). More specifically, the wall portion 80 is disposed above the laminated substrate 2 and is formed of a plate-like body extending in the up-down direction. The wall portion 80 plays a role of partitioning the internal space R (or the sealing resin 7) of the case 6 into at least two. The wall portion 80 is disposed at a position spaced apart from the side wall 61 of the case 6. Furthermore, as described above, the lower ends of the wall portions 80 are joined in contact with the upper surfaces of the circuit plates 22 and 23.

The first beam 81 is formed of an elongated body extending in the Y direction. An end on the negative side in the Y direction of the first beam 81 is connected or joined to the side wall 61, and an end on the positive side in the Y direction is continued to the wall portion 80. Furthermore, a lower end of the first beam 81 is in contact with the upper surface of the inner terminal portion 63*a* of the main terminal 63.

The second beam 82 is formed of an elongated body extending in the Y direction. An end on the positive side in the Y direction of the second beam 82 is connected to or joined to the side wall 61, and an end on the negative side in the Y direction is continued to the wall portion 80. Furthermore, a predetermined gap is formed between a lower surface of the second beam 82 and the upper surface of the control terminal 64 (inner terminal portion 64*a*). The wiring member W1 for control is joined to the upper surface of the inner terminal portion 64*a*.

Furthermore, the sealing resin 7 is interposed in the gap between the second beam 82 and the control terminal 64. That is, the wiring member W1 positioned between the second beam 82 and the control terminal 64 is sealed by the sealing resin 7. As described above, the second beam 82 is disposed so as to avoid the wiring member W1. Note that the same configuration as the second beam 82 may be applied to the first beam 81. Note that, in the present embodiment, the case where the first beam 81 and the second beam 82 are connected to the wall portion 80 has been described, but the present invention is not limited thereto, and can be appropriately changed. For example, one beam may be formed to extend between the pair of opposing side walls 61. In this case, the wall portion 80 may be formed to extend downward, for example, from a part of the beam. Furthermore, the wall portion 80 and each of the beams may be integrally formed.

Furthermore, as illustrated in FIG. 5, the partition wall 8 preferably includes a portion extending obliquely with respect to the longitudinal direction in plan view. For example, the wiring member W1 connecting the semiconductor element 4 and the main terminal 63 extends obliquely. Therefore, by disposing a part of the partition wall 8 along the wiring member W1, it is possible to realize sorting of spaces (sealing resin 7) without interference between the wiring member W1 and the partition wall 8.

Note that, in the above embodiment, the case where the internal space R of the case 6 is divided into the three spaces R1 to R3 by the two partition walls 8, that is, the sealing resin 7 is divided into three has been described, but the present invention is not limited to this configuration. The number of the partition walls 8 and the number of divisions of the space (sealing resin 7) can be appropriately changed. Furthermore, the plurality of partition walls 8 may be integrated.

Furthermore, each of the partition walls 8 may have higher rigidity than the sealing resin 7. Alternatively, the partition wall 8 may have lower rigidity than the sealing resin 7. That is, the partition wall 8 is preferably made of a material different from the sealing resin 7. For example, the partition wall 8 may be formed of the equivalent material as the case 6. Here, the equivalent material does not exclude the inclusion of other impurities in addition to (a part of) the components contained in the case 6. That is, the material of the partition wall 8 and the material of the case 6 may not completely match.

Furthermore, the wall portion 80 and each of the beams may be formed of the same material. In this case, the wall portion 80 and the beams may be integrally formed. The case 6, the wall portion 80, and the beams may all be made of the same material. In this case, the case 6, the wall portion 80, and the beams may be integrally formed. Furthermore, the beams may be made of metal. In this case, the beams may be insert-molded in the wall portion 80. Furthermore, the partition wall 8 may be insert-molded in the case 6. Furthermore, the partition wall 8 and the case 6 may be integrally molded.

As described above, according to the present embodiment, by dividing the internal space R of the case 6 into the plurality of spaces R1 to R3 by the partition walls 8, it is possible to suppress warpage of the laminated substrate 2 due to shrinkage during curing of the sealing resin 7 and to prevent cracks and peeling at the interface of the sealing resin 7.

In the present embodiment, the first beam 81 and the second beam 82 are fixed to the side walls 61. Furthermore, the upper ends of the wall portions 80 are fixed to the first beam 81 and the second beam 82, respectively. Moreover, the lower ends of the wall portions 80 is joined to the upper surfaces of the circuit plates 22 and 23. As a result, when the sealing resin 7 shrinks, there is an effect that warpage is suppressed by pulling up the laminated substrate 2 from warping convexly downward.

Furthermore, the reason why the laminated substrate 2 warps so as to protrude downward due to shrinkage of the sealing resin 7 is that the laminated substrate 2 at the bottom of the side wall 60 of the case 6 serves as a fastener and only the module upper portion shrinks. That is, the laminated substrate 2 itself functions as a beam. The beams (the first beam 81 and the second beam 82) are bridged by the upper portions (the side opposite to the laminated substrate 2) of the two opposing side walls 61.

As a result, the beams become a fastener (which may be referred to as a fastening rod) at the upper portion of the two opposing side walls 61. For this reason, by suppressing excessive shrinkage of the upper portion of the module and suppressing warpage of the entire module, as a result, it is possible to suppress the laminated substrate 2 from being warped convexly downward.

On the other hand, when the sealing resin 7 expands during the operation of the device, the partition wall 8 presses the laminated substrate 2 from being warped concavely downward (convexly upward) to suppress the warpage. Note that, in this case, the lower ends of the wall portions 80 only need to be in contact with the upper surfaces of the circuit plates 22 and 23, and is not necessarily joined.

Furthermore, when the sealing resin 7 expands, the laminated substrate 2 serves as a fastener at the module bottom portion, so that only the module upper portion expands and the laminated substrate 2 tends to warp convexly upward. Also in this case, the beams serves as a fastener at an upper portion of the two opposing side walls 61. Therefore, by suppressing the expansion of the module upper portion and suppressing the warpage of the entire module, the warpage of the laminated substrate 2 itself can also be suppressed. Note that, in this case, in order to cause the beams to function as a fastener, the beams need to be joined to the side walls 61.

Figure 9:
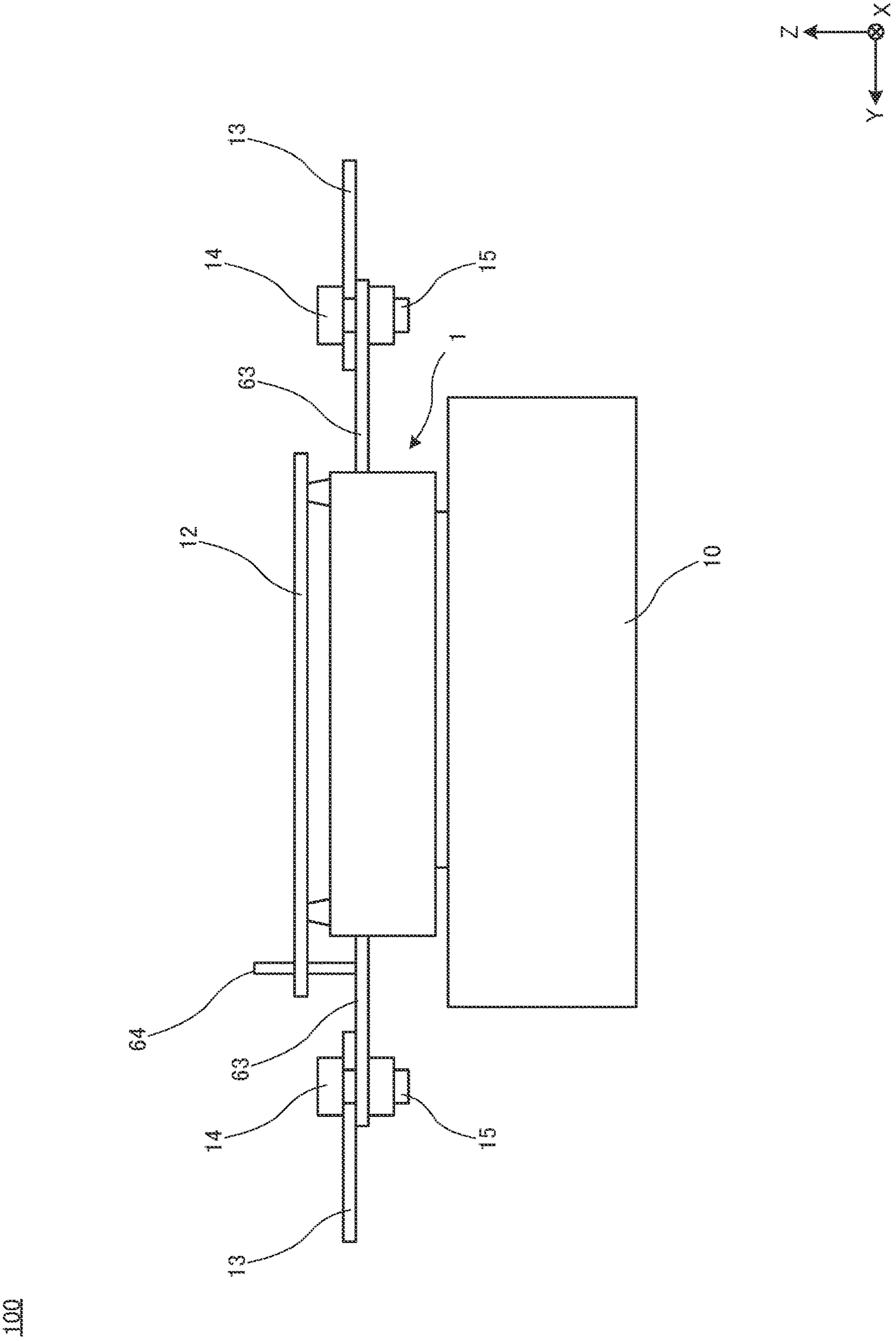
FIG. 9 is a schematic diagram illustrating a semiconductor device according to a modification example.
Figure 10:
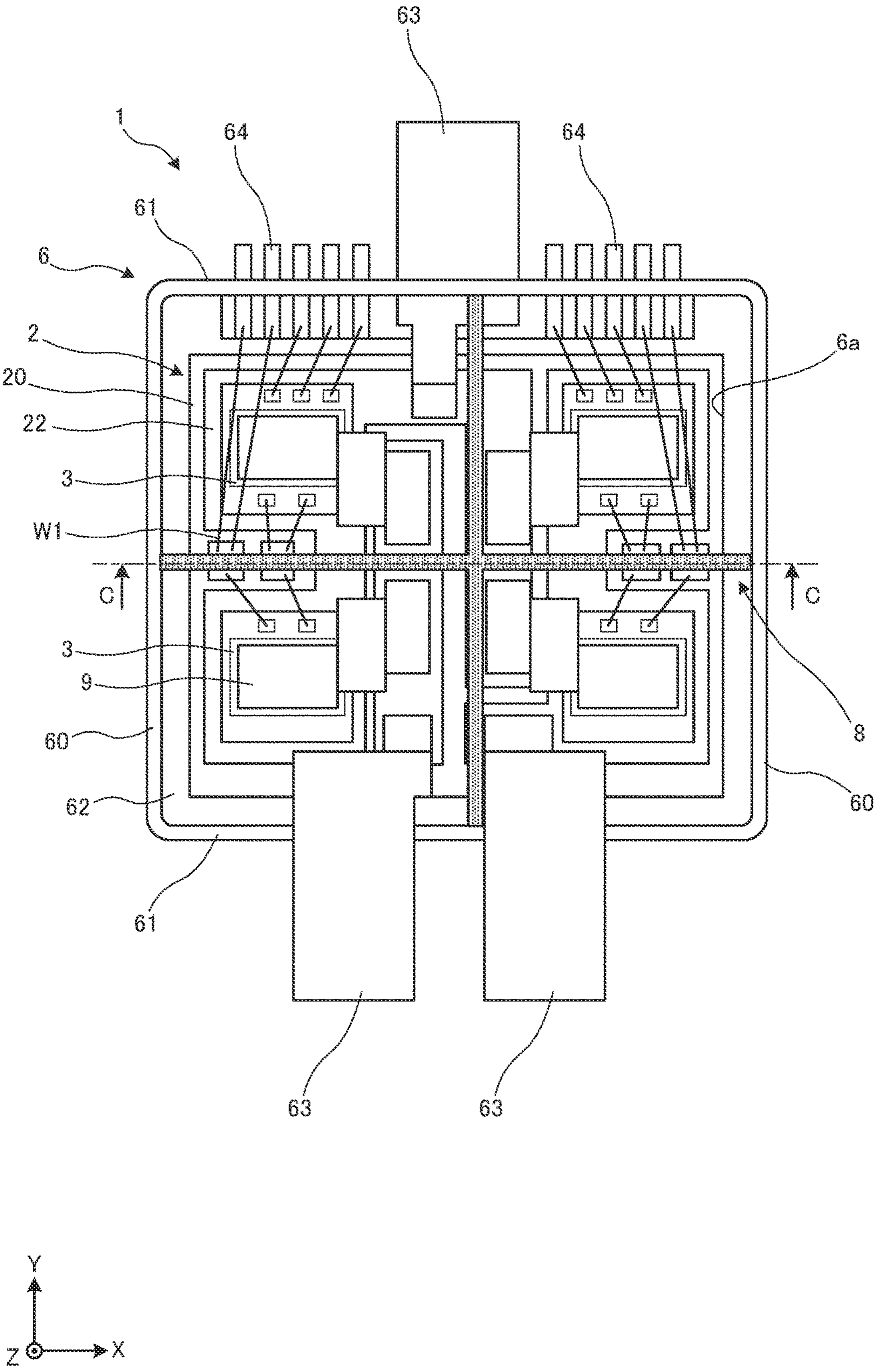
FIG. 10 is a plan view of a semiconductor module according to a modification example.
Figure 11:
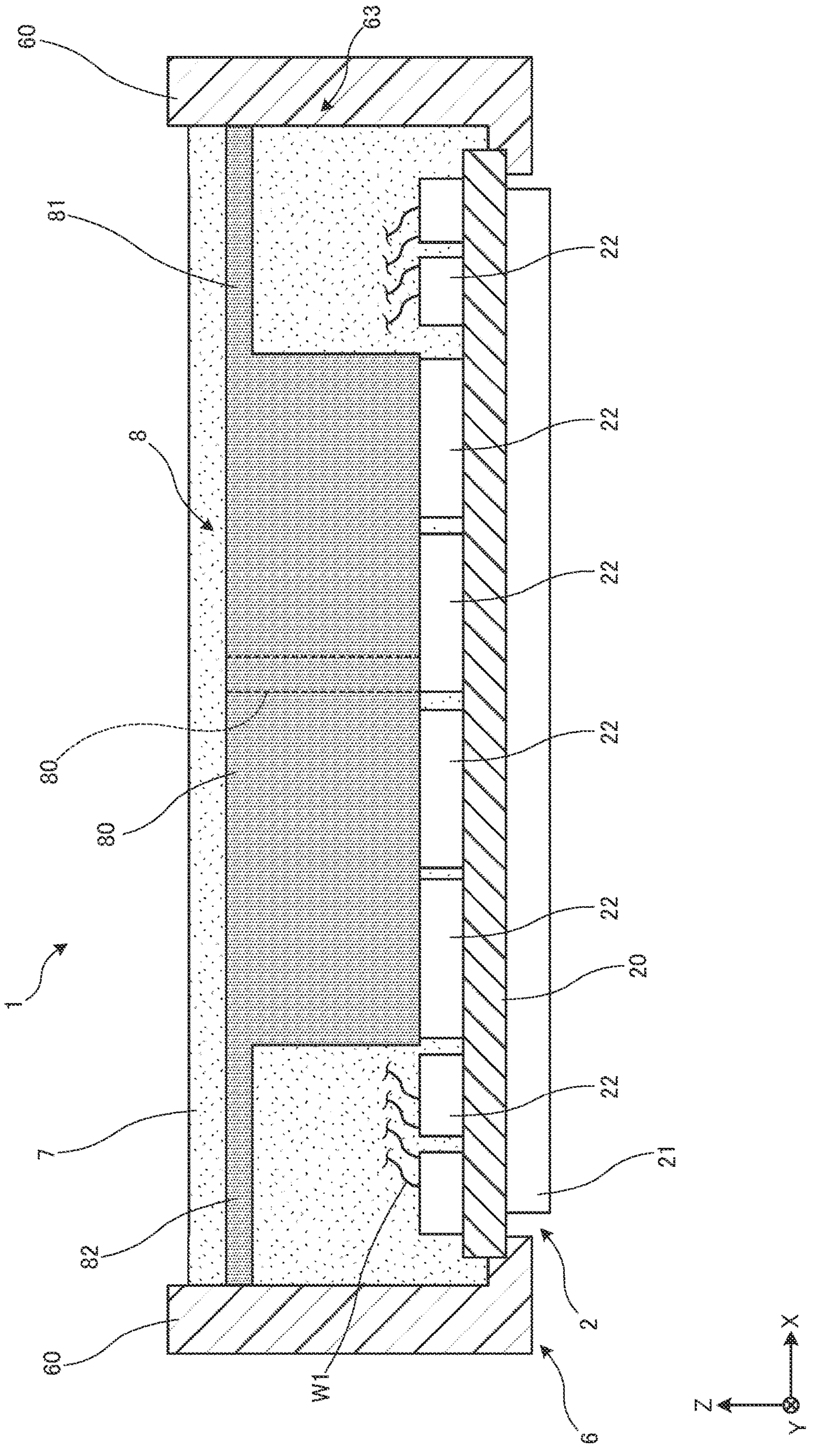
FIG. 11 is a cross-sectional view taken along line C-C in FIG. 10.
Figure 12:
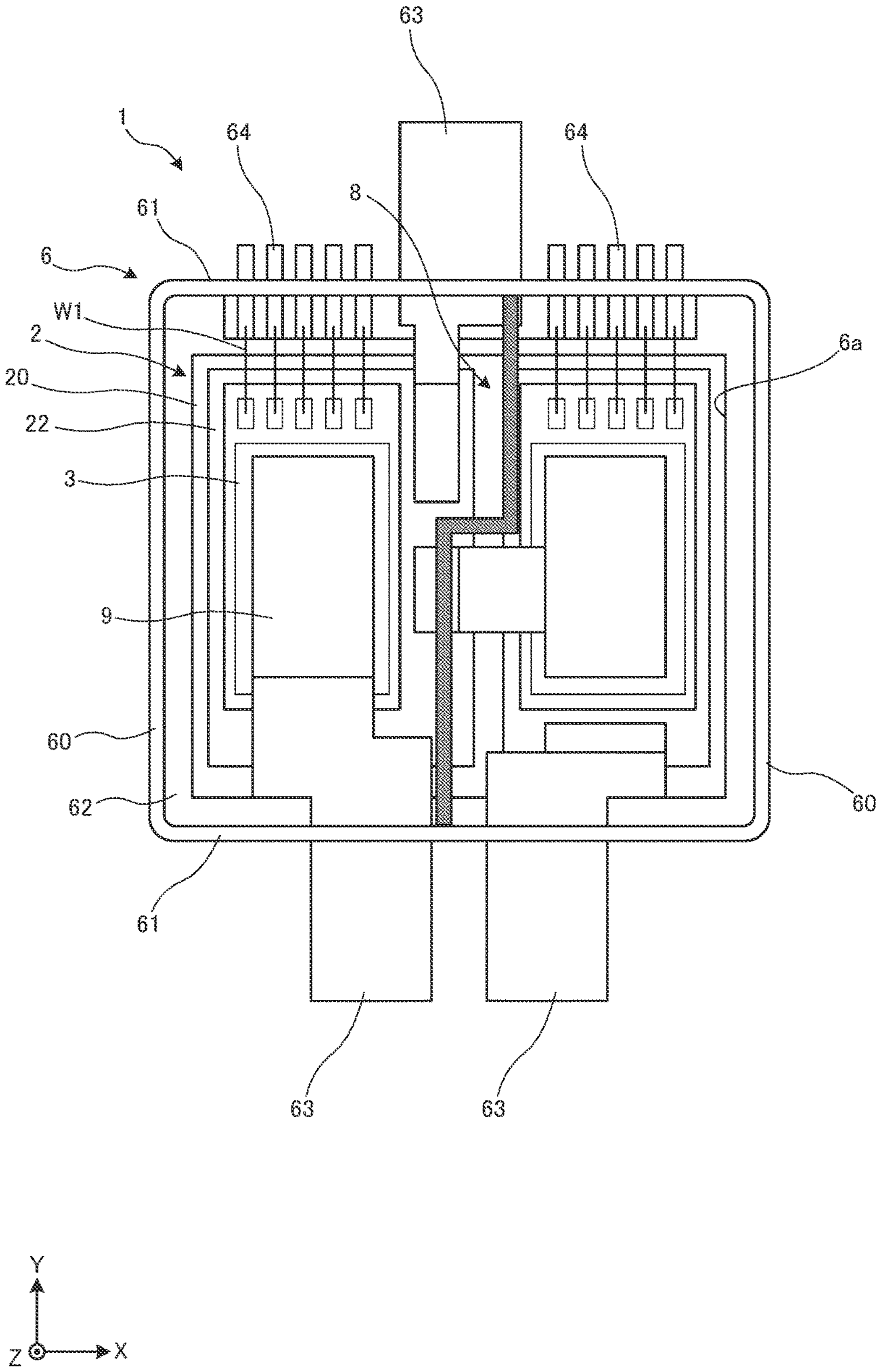
FIG. 12 is a plan view of a semiconductor module according to another modification example.
Figure 13A:
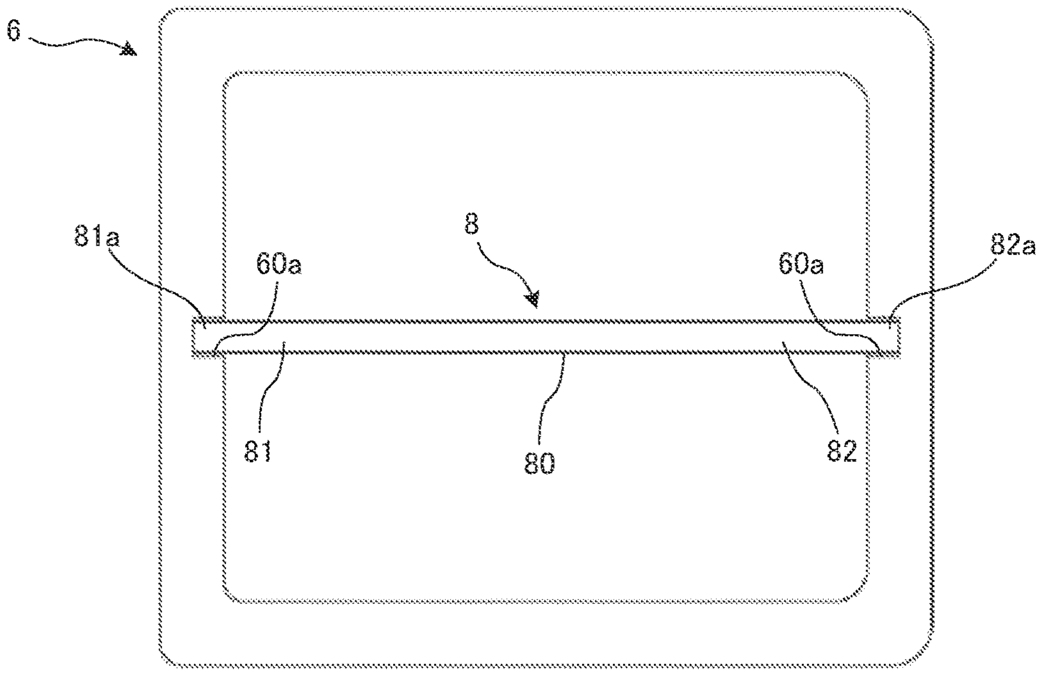
FIGS. 13A and 13B are schematic views illustrating variations of a connection configuration of a partition wall according to the present embodiment.
Figure 13B:
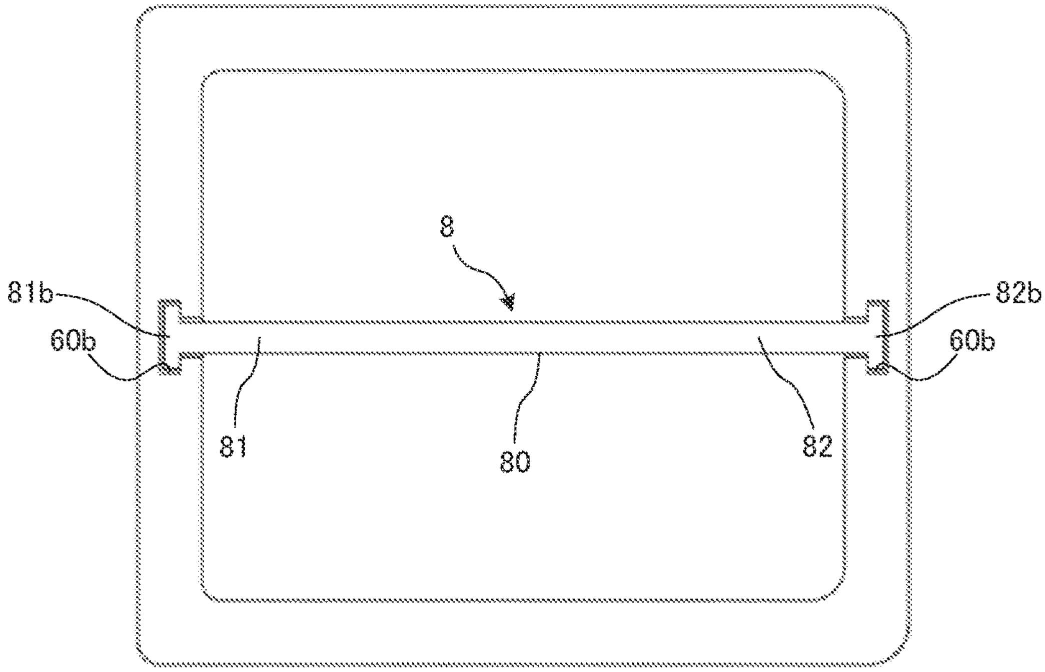

Next, modification examples will be described with reference to FIGS. 9 to 13B. FIG. 9 is a schematic diagram illustrating a semiconductor device according to a modification example. FIG. 10 is a plan view of a semiconductor module according to the modification example. FIG. 11 is a cross-sectional view taken along line C-C in FIG. 10. FIG. 12 is a plan view of a semiconductor module according to another modification example. FIGS. 13A and 13B are schematic views illustrating variations of a connection configuration of a partition wall according to the present embodiment. Note that, in the following modification example, the basic configurations of various components of the semiconductor module and the semiconductor device are the same as those of the above-described embodiment except for the shape and layout. Therefore, only the differences will be mainly described, and the already described configurations will be denoted by the same names and the same reference signs, and the description thereof will be omitted as appropriate.

In the above embodiment, an intelligent power module (IPM) in which the integrated circuit element 5 is mounted in the module has been described as an example, but the present invention is not limited thereto. For example, as illustrated in FIG. 9, in the semiconductor device 100, the heat sink 10 may be disposed on the lower surface of the semiconductor module 1, and a control board 12 may be disposed on the upper surface of the semiconductor module 1.

The control board 12 is a so-called printed board, and a circuit pattern for control is formed on a surface of the control board. A plurality of through holes (not illustrated) penetrating in a thickness direction is formed in the control board 12. The tip of each of the control terminals 64 (outer terminal portions 64*b*) of the semiconductor module 1 is inserted into each of the through holes.

Furthermore, a bus bar 13 is connected to a distal end of each of the main terminals 63. The main terminal 63 and the bus bar 13 are fastened and fixed by a bolt 14 and a nut 15.

Furthermore, as in the modification example illustrated in FIGS. 10 and 11, the partition wall 8 may have a cross shape in plan view. In this case, the internal space R of the case 6 is divided into four spaces in a matrix of two rows and two columns in plan view, and one semiconductor element 3 is disposed in each space. Furthermore, the partition wall 8 may have a T-shape in a cross-sectional view. The semiconductor element 3 in the modification example is a so-called RC-IGBT element. The upper electrode of the semiconductor element 3 and the predetermined circuit plate 22 may be electrically connected by a metal wiring board 9 (which may be referred to as a lead frame).

In the examples of FIGS. 10 and 11, it is preferable that the semiconductor element 3 does not extend over the adjacent spaces. That is, the semiconductor element 3 is preferably disposed so as not to overlap with the cross-shaped partition wall 8 in top view. Furthermore, preferably, one metal wiring board 9 is disposed in each space, and does not extend over the adjacent spaces (does not overlap the cross-shaped partition wall 8 in top view). Furthermore, it is preferable that the bonding wire is also disposed in each space and does not straddle the adjacent spaces (does not overlap the cross-shaped partition wall 8 in top view).

Furthermore, as illustrated in FIG. 12, the partition wall 8 may have a crank shape in plan view. In FIG. 12, the internal space R of the case 6 is divided into two spaces by one partition wall 8. In FIG. 12, since the partition wall 8 is bent in a crank shape in order to avoid the main terminal 63 and the metal wiring board 9, the internal space R of the case 6 can be divided into a plurality of parts without the partition wall 8 interfering with the peripheral configurations.

Also in the example of FIG. 12, it is preferable that the semiconductor element 3 does not extend over the adjacent spaces (does not overlap the crank-shaped partition wall 8 in top view). Furthermore, it is preferable that the bonding wire is also disposed in each space and does not straddle the adjacent space (does not overlap the crank-shaped partition wall 8 in top view).

As described above, in each modification example, the internal space R of the case 6 can be appropriately divided by providing variations in the shape of the partition wall 8 according to the layout of various components in the semiconductor module 1.

Furthermore, as illustrated in FIGS. 13A and 13B, the partition wall 8 is preferably engaged with the side walls of the case 6. For example, as illustrated in FIG. 13A, grooves 60*a* are formed in the side walls of the case 6. It is preferable that an end 81*a* of the first beam 81 or an end 82*a* of the second beam 82 is engaged (or fitted) in each of the grooves 60*a*.

Furthermore, as illustrated in FIG. 13B, grooves 60*b* having a T-shape in plan view are formed in the side walls of the case 6. It is preferable that an end 81*b* of the first beam 81 or an end 82*b* of the second beam 82 is engaged (or fitted) in each of the grooves 60*b*. The ends 81*b* and 82*b* may be formed in a T-shape in plan view corresponding to the grooves 60*b*. In the examples of FIGS. 13A and 13B, each end of the beams may be joined by an adhesive in the grooves.

Furthermore, in the above-described embodiment, the numbers and arrangement locations of the semiconductor elements 3 and 4 are not limited to the above-described configuration, and can be appropriately changed.

Furthermore, in the above embodiment, the number and layout of the circuit plates are not limited to the above configuration, and can be appropriately changed.

Furthermore, in the above embodiment, the laminated substrate 2 and the semiconductor elements 3 and 4 are formed in a rectangular shape or a square shape in plan view, but the present invention is not limited to this configuration. These configurations may be formed in a polygonal shape other than the above.

Furthermore, the present embodiment and the modification examples have been described, but as another embodiment, the above-described embodiment and the modification examples may be wholly or partially combined.

Furthermore, the present embodiment is not limited to the above-described embodiment and modification examples, and various changes, substitutions, and modification examples may be made without departing from the spirit of the technical idea. Moreover, when the technical idea can be realized in another manner by the progress of the technology or another derived technology, the technology may be implemented by using the manner. Thus, the claims cover all implementations that may be included within the scope of the technical idea.

Feature points in the embodiments described above will be summarized below.

A semiconductor module according to the above embodiment includes: a laminated substrate configured by laminating an insulating plate including an upper surface and a lower surface, a heat dissipation plate disposed on the lower surface of the insulating plate, and a circuit plate disposed on the upper surface of the insulating plate; a semiconductor element disposed on an upper surface of the circuit plate; a case that surrounds the laminated substrate and houses the semiconductor element; a sealing resin that is filled in the case and seals the semiconductor element; and a partition wall that extends in an up-down direction and divides the sealing resin into a plurality of the sealing resins, in which an end of the partition wall is connected to at least a part of the upper surface of the circuit plate.

Furthermore, in the semiconductor module according to the above-described embodiment, the insulating plate or the heat dissipation plate includes a plurality of curved portions formed at positions corresponding to immediately below the plurality of divided sealing resins, and each of the curved portion has a shape protruding downward.

Furthermore, in the semiconductor module according to the above embodiment, a boundary between the adjacent curved portions is located immediately below the partition wall.

Furthermore, in the semiconductor module according to the above-described embodiment, a curved surface recessed downward is formed on an upper surface of each of the plurality of divided sealing resins.

Furthermore, in the semiconductor module according to the above-described embodiment, a boundary between the adjacent curved surfaces is located directly above the partition wall.

Furthermore, in the semiconductor module according to the above embodiment, the case includes a pair of opposing side walls, the partition wall includes: a first beam connected to one of the side walls; a second beam connected to another of the side walls; and a wall portion that continues to the first beam and the second beam and partitions a space into at least two, and the wall portion extends in an up-down direction, and a lower end of the wall portion is in contact with at least a part of the upper surface of the circuit plate.

Furthermore, in the semiconductor module according to the above-described embodiment, a plurality of terminals is provided on the pair of side walls.

Furthermore, in the semiconductor module according to the above-described embodiment, a stepped portion is formed on an inner surface of each of the pair of side walls, an upper surface of each of the terminals is exposed from the stepped portion, and a lower end of the first beam is in contact with the upper surface of the terminal.

Furthermore, in the semiconductor module according to the above-described embodiment, a stepped portion is formed on an inner surface of each of the pair of side walls, an upper surface of each of the terminals is exposed from the stepped portion, and the sealing resin is interposed between the second beam and the upper surface of the terminal.

Furthermore, in the semiconductor module according to the above embodiment, the terminal provided on the wall portion to which the first beam is connected constitutes a main terminal for a main current, and the terminal provided on the wall portion to which the second beam is connected constitutes a control terminal for control.

Furthermore, the semiconductor module according to the above embodiment further includes a wiring member bonded to an upper surface of the control terminal, and the wiring member is sealed with the sealing resin between the wiring member and the second beam.

Furthermore, in the semiconductor module according to the above embodiment, the insulating plate has a rectangular shape elongated in a predetermined direction, a plurality of the circuit plates is arranged side by side in a longitudinal direction of the insulating plate, and the pair of side walls faces each other in a lateral direction of the insulating plate.

Furthermore, in the semiconductor module according to the above embodiment, the partition wall includes a portion extending obliquely with respect to the longitudinal direction in plan view.

Furthermore, in the semiconductor module according to the above embodiment, the partition wall has a cross shape in plan view.

Furthermore, in the semiconductor module according to the above embodiment, the partition wall has a T-shape in a cross-sectional view.

Furthermore, in the semiconductor module according to the above embodiment, the partition wall has a crank shape in plan view.

Furthermore, in the semiconductor module according to the above embodiment, the partition wall is formed of a material equivalent to a material of the case.

Furthermore, the semiconductor device according to the above embodiment includes: the above semiconductor module; and a heat sink disposed on a lower surface of the heat dissipation plate.

As described above, the present invention has an effect of suppressing warpage of the laminated substrate due to shrinkage during curing of the sealing resin, and is particularly useful for a semiconductor module and a semiconductor device for industrial or electrical equipment.

The present application is based on Japanese Patent Application No. 2021-168928 filed on Oct. 14, 2021. All the contents are included here.

What is claimed is:

1. A semiconductor module, comprising:
- a laminated substrate configured by laminating
  - an insulating plate having an upper surface and a lower surface opposite to each other in an up-down direction,
  - a heat dissipation plate disposed on the lower surface of the insulating plate, and
  - a circuit plate disposed on the upper surface of the insulating plate;
- a semiconductor element disposed on an upper surface of the circuit plate;
- a case that surrounds the laminated substrate and has a space housing the semiconductor element;
- a sealing resin that fills the space of the case to seal the semiconductor element; and
- a partition wall that extends in the up-down direction to divide the space filled with the sealing resin into a plurality of subspaces, wherein
- the case includes first and second side walls that face each other, the semiconductor element being disposed between the first and second walls, and
- the partition wall includes:
  - a wall portion extending in the up-down direction, and having a lower end and an upper end opposite to each other in the up-down direction, at least a portion of the lower end of the wall portion being in contact with the upper surface of the circuit plate,
  - a first beam connecting the upper end of the wall portion to the first side wall, and
  - a second beam connected the upper end of the wall portion to the second side wall,
- at least one of the first beam and the second beam having the sealing resin thereunder in the up-down direction.

2. The semiconductor module according to claim 1, wherein
- the insulating plate and/or the heat dissipation plate includes a plurality of curved portions protruding downward away from the semiconductor element, and
- each of the plurality of curved portions is located at a position immediately below a corresponding one of the plurality of subspaces.

3. The semiconductor module according to claim 2, wherein a boundary between an adjacent two of the plurality of curved portions is located at a position immediately below the partition wall.

4. The semiconductor module according to claim 1, wherein each of the plurality of subspaces is filled with the sealing resin and has a curved upper surface that is recessed downward toward the semiconductor element.

5. The semiconductor module according to claim 4, wherein the partition wall is located at a boundary between an adjacent two of the plurality of subspaces.

6. The semiconductor module according to claim 1, further comprising a plurality of terminals provided in each of the first and second side walls.

7. The semiconductor module according to claim 1, wherein
- the insulating plate has a rectangular shape elongated in a longitudinal direction, the circuit plate is provided in plurality and the plurality of circuit plates are arranged side by side in the longitudinal direction on the insulating plate, and the first and second side walls face each other in a lateral direction orthogonal to the longitudinal direction.

8. The semiconductor module according to claim 7, wherein the partition wall includes a portion extending obliquely with respect to the longitudinal direction when viewed from the up-down direction.

9. The semiconductor module according to claim 1, wherein the partition wall has a cross shape when viewed from the up-down direction.

10. The semiconductor module according to claim 1, wherein the partition wall has a T-shape when viewed from a direction orthogonal to the up-down direction.

11. The semiconductor module according to claim 1, wherein the partition wall has a crank shape when viewed from the up-down direction.

12. The semiconductor module according to claim 1, wherein the partition wall is made of a material identical to or at least partially identical to a material of the case.

13. A semiconductor device comprising:

the semiconductor module according to claim 1; and a heat sink disposed on a lower surface of the heat dissipation plate of the semiconductor module.

14. The semiconductor module, comprising:

a laminated substrate configured by laminating an insulating plate having an upper surface and a lower surface opposite to each other in an up-down direction, a heat dissipation plate disposed on the lower surface of the insulating plate, and a circuit plate disposed on the upper surface of the insulating plate;

a semiconductor element disposed on an upper surface of the circuit plate;

a case that surrounds the laminated substrate and has a space housing the semiconductor element;

a sealing resin that fills the space of the case to seal the semiconductor element; and a partition wall that extends in the up-down direction to divide the space filled with the sealing resin into a plurality of subspaces, the partition wall having a lower end and an upper end opposite to each other in the up-down direction, at least a portion of the lower end of the partition wall being connected to the upper surface of the circuit plate, wherein the case includes first and second side walls that face each other, the semiconductor element being disposed between the first and second walls, the partition wall includes:

a first beam connected to the first side wall;

a second beam connected to the second side wall; and a wall portion connecting the first beam to the second beam and extending in the up-down direction to divide the space into at least two of the plurality of subspaces, the wall portion having a lower end and an upper end opposite to each other in the up-down direction and at least a portion of the lower end of the wall portion is in contact with the upper surface of the circuit plate, the semiconductor module further includes a plurality of terminals provided in each of the first and second side walls, each of the first and second side walls has a stepped portion formed on an inner surface thereof, each of the plurality of terminals is embedded in a corresponding one of the first and second side walls, and an upper surface of each of the terminals is exposed from the corresponding one of the first and second side walls at the stepped portion, and a lower end of the first beam is in contact with the upper surface of a corresponding one of the plurality of terminals embedded in the first side wall.

15. The semiconductor module, comprising:

a laminated substrate configured by laminating an insulating plate having an upper surface and a lower surface opposite to each other in an up-down direction, a heat dissipation plate disposed on the lower surface of the insulating plate, and a circuit plate disposed on the upper surface of the insulating plate;

a semiconductor element disposed on an upper surface of the circuit plate;

a case that surrounds the laminated substrate and has a space housing the semiconductor element;

a sealing resin that fills the space of the case to seal the semiconductor element; and a partition wall that extends in the up-down direction to divide the space filled with the sealing resin into a plurality of subspaces, the partition wall having a lower end and an upper end opposite to each other in the up-down direction, at least a portion of the lower end of the partition wall being connected to the upper surface of the circuit plate, wherein the case includes first and second side walls that face each other, the semiconductor element being disposed between the first and second walls, the partition wall includes:

a first beam connected to the first side wall;

a second beam connected to the second side wall; and a wall portion connecting the first beam to the second beam and extending in the up-down direction to divide the space into at least two of the plurality of subspaces, the wall portion having a lower end and an upper end opposite to each other in the up-down direction and at least a portion of the lower end of the wall portion is in contact with the upper surface of the circuit plate, the semiconductor module further includes a plurality of terminals provided in each of the first and second side walls, each of the first and second side walls has a stepped portion formed on an inner surface thereof, each of the plurality of terminals is embedded in a corresponding one of the first and second side walls, and an upper surface of each of the terminals is exposed from the corresponding one of the first and second side walls at the stepped portion, and the sealing resin is interposed between the second beam and the upper surface of a corresponding one of the plurality of terminals embedded in the second side wall.

16. The semiconductor module according to claim 15, wherein one of the plurality of terminals provided in the first side wall constitutes a main terminal for a main current flowing through the semiconductor element, and the corresponding one of the plurality of the terminals embedded in the second side wall constitutes a control terminal for controlling the semiconductor element.

17. The semiconductor module according to claim 16, further comprising a wiring member bonded to an upper surface of the control terminal, wherein the wiring member is sealed with the sealing resin between the wiring member and the second beam.

* * * * *